(12) United States Patent
Handa

(10) Patent No.: US 12,410,922 B2
(45) Date of Patent: Sep. 9, 2025

(54) OUTDOOR UNIT OF AIR CONDITIONER

(71) Applicant: Carrier Japan Corporation, Tokyo (JP)

(72) Inventor: Yuichi Handa, Fuji (JP)

(73) Assignee: Carrier Japan Corporation, Tokyo (JP)

( * ) Notice: Subject to any disclaimer, the term of this patent is extended or adjusted under 35 U.S.C. 154(b) by 179 days.

(21) Appl. No.: 18/043,424

(22) PCT Filed: Sep. 11, 2020

(86) PCT No.: PCT/JP2020/034502
§ 371 (c)(1),
(2) Date: Feb. 28, 2023

(87) PCT Pub. No.: WO2022/054233
PCT Pub. Date: Mar. 17, 2022

(65) Prior Publication Data
US 2023/0324054 A1    Oct. 12, 2023

(51) Int. Cl.
*H05K 7/20* (2006.01)
*F24F 1/24* (2011.01)

(52) U.S. Cl.
CPC .......... *F24F 1/24* (2013.01); *H05K 7/20218* (2013.01); *H05K 7/2039* (2013.01)

(58) Field of Classification Search
CPC ...... F24F 1/24; H05K 7/20218; H05K 7/2039
USPC ...................................................... 361/699
See application file for complete search history.

(56) References Cited

U.S. PATENT DOCUMENTS

| | | | | |
|---|---|---|---|---|
| 2005/0044861 A1* | 3/2005 | Cho | ............... | F25B 13/00 62/81 |
| 2016/0320077 A1* | 11/2016 | Kim | ............... | B22D 17/00 |
| 2019/0301753 A1* | 10/2019 | Taniguchi | .......... | F24F 11/89 |
| 2020/0326092 A1* | 10/2020 | Song | ............. | F25B 25/005 |

FOREIGN PATENT DOCUMENTS

| | | |
|---|---|---|
| CN | 106091168 A | 11/2016 |
| CN | 107023904 A | 8/2017 |
| CN | 207118139 U | 3/2018 |
| JP | H06323567 A | 11/1994 |
| JP | 2008121966 A | 5/2008 |

(Continued)

OTHER PUBLICATIONS

International Search Report issued on Nov. 10, 2020, in corresponding International Application No. PCT/JP2020/034502; 4 pages.

(Continued)

*Primary Examiner* — Zhengfu J Feng
(74) *Attorney, Agent, or Firm* — Maier & Maier, PLLC

(57) ABSTRACT

An outdoor unit of an air conditioner includes: an electrical component box formed into a box shape; a waterproof cover that covers the electrical component box; and a refrigerant cooling heat sink that comes into contact with a back surface of the electrical component box. The refrigerant cooling heat sink is attached to an inner surface of the waterproof cover, and a relative position of the electrical component box with respect to the refrigerant cooling heat sink is set by the electrical component box being attached to a predetermined position of the waterproof cover.

6 Claims, 12 Drawing Sheets

(56) References Cited

FOREIGN PATENT DOCUMENTS

| JP | 2010145054 A | | 7/2010 | | |
|---|---|---|---|---|---|
| JP | 2011099577 A | * | 5/2011 | ................ | F24F 1/24 |
| JP | 2013194959 A | | 9/2013 | | |
| JP | 2016065705 A | | 4/2016 | | |
| JP | 2017161120 A | | 9/2017 | | |
| KR | 1020160129357 A | | 11/2016 | | |
| WO | 2018016064 A1 | | 1/2018 | | |

OTHER PUBLICATIONS

Extended Search Report issued May 2, 2024, in corresponding European Patent Application No. 20953298.5, 8 pages.
Office Action issued on Aug. 1, 2023, in corresponding Japanese Application No. 2022-547325, 9 pages.
Office Action issued on Sep. 24, 2024, in corresponding Chinese Application No. 202080105023.2, 14 pages.

* cited by examiner

FRONT VIEW

CROSS-SECTIONAL BOTTOM VIEW

STATE BEFORE ATTACHMENT

STATE AFTER ATTACHMENT

LEFT SIDE ASSEMBLED STATE

RIGHT SIDE ASSEMBLED STATE

HIGH-POWER TYPE

MEDIUM-POWER TYPE ially long rectangular parallelepiped shape, and an electrical component box 2, a waterproof cover 3 that covers the electrical component box 2, and various pipes, components, and the like configuring a refrigerating cycle are disposed therein. These components include a compressor, a heat exchanger, a liquid receiver, an accumulator, an oil separator, a fan device, and the like that configure the refrigerating cycle and are disposed by using a beam or a pole of the outdoor unit 1 or a structure such as a floor surface.

OUTDOOR UNIT OF AIR CONDITIONER

TECHNICAL FIELD

Embodiments of the present invention relate to an outdoor unit of an air conditioner.

BACKGROUND ART

An outdoor unit of an air conditioner includes an electrical component box for accommodating electrical components. The electrical component box may use a refrigerant cooling heat sink that performs cooling with a refrigerant as a cooler for cooling the electrical component box as in Patent Literature 1, for example, since the electrical components accommodated therein generate heat during operation.

CITATION LIST

Patent Literature

Patent Literature 1: International Publication No. WO 2018/016064

SUMMARY OF INVENTION

Technical Problem

Such an electrical component box basically has an upper surface and side surfaces blocked to prevent invasion of rain water into the casing and includes an opening provided in the front surface, for example, to allow access to the inside of the casing. Additionally, the electrical component box is arranged to secure a contact area by bringing the back surface, for example, with no opening formed therein into contact with the refrigerant cooling heat sink thereby to provide efficient cooling.

However, in a case where the electrical component box is attached in a state where the refrigerant cooling heat sink is fixed in advance, it is necessary to release the fixation of the refrigerant cooling heat sink once, to adjust the position, and to attach it again when the electrical component box is displaced, and there is thus a concern of degradation of operation efficiency. Also, it is necessary to mount the refrigerant cooling heat sink at a location where it can be visually recognized, and there is a concern that arrangement including other components may be limited.

Thus, an outdoor unit of an air conditioner enabling an electrical component box and a refrigerant cooling heat sink to be easily aligned is provided.

Solution to Problem

An outdoor unit of an air conditioner according to an embodiment includes: an electrical component box; a waterproof cover that covers the electrical component box; and a refrigerant cooling heat sink that cools the electrical component box, the refrigerant cooling heat sink being attached to an inner surface of the waterproof cover, and a relative position of the electrical component box with respect to the refrigerant cooling heat sink being set by the electrical component box being attached to a predetermined position of the waterproof cover.

DESCRIPTION OF EMBODIMENTS

Hereinafter, a plurality of embodiments will be described with reference to the drawings. Also, the same reference signs will be applied to common parts in each embodiment for simplification of description. Additionally, each embodiment can be applied not only to a so-called air conditioning for adjusting the indoor temperature but also to applications that can be addressed by a refrigerating cycle apparatus such as a refrigerator for cooling devices or for cooling articles in a showcase or the like.

First Embodiment

Hereinafter, a first embodiment will be described. As illustrated as a front view in FIG. 1, an outdoor unit 1 of an air conditioner according to the present embodiment has an outer shape formed substantially into a vertically long rectangular parallelepiped shape, and an electrical component box 2, a waterproof cover 3 that covers the electrical component box 2, and various pipes, components, and the like configuring a refrigerating cycle are disposed therein. These components include a compressor, a heat exchanger, a liquid receiver, an accumulator, an oil separator, a fan device, and the like that configure the refrigerating cycle and are disposed by using a beam or a pole of the outdoor unit 1 or a structure such as a floor surface.

Figure 1:
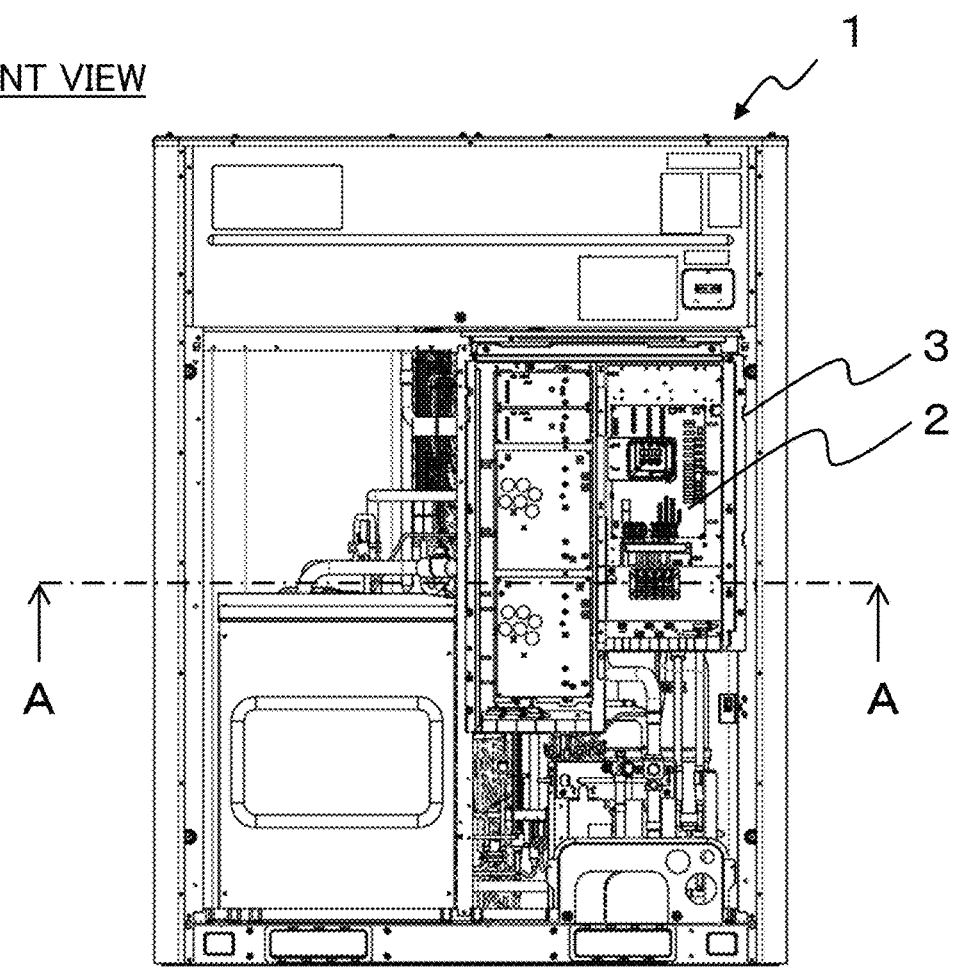
FIG. 1 is a diagram schematically illustrating a configuration of an outdoor unit according to a first embodiment.
Figure 1:
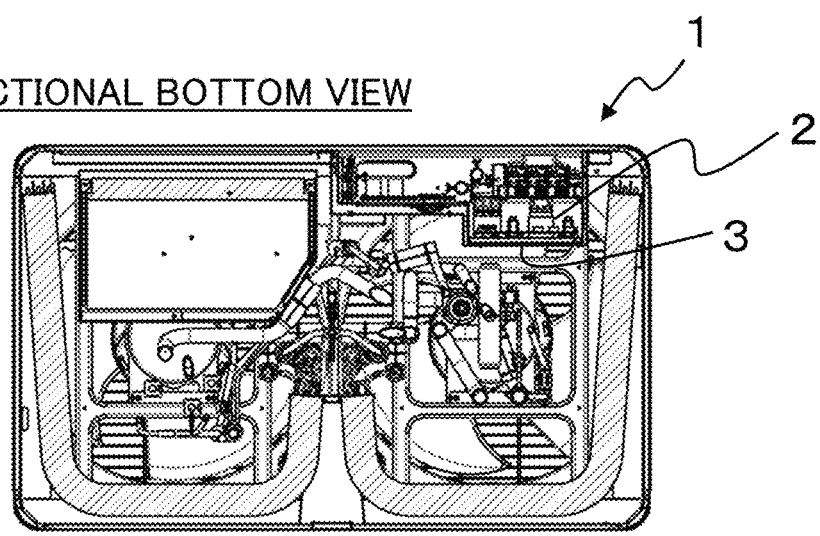

Also, as illustrated as a cross-sectional bottom view illustrating a sectional view along the line A-A in FIG. 1, other components and pipes are arranged on sides of side surfaces and back surfaces of the electrical component box 2 and the waterproof cover 3 in this state. In other words, the electrical component box 2 and the waterproof cover 3 are disposed in a state where there is a relatively narrow space available around them. Note that although FIG. 1 illustrates a state where the inside of the outdoor unit 1 and the inside of the electrical component box 2 are visible, each of the front surface side of the outdoor unit 1 and the front surface side of the electrical component box 2 is blocked by a panel during operation.

Figure 2:
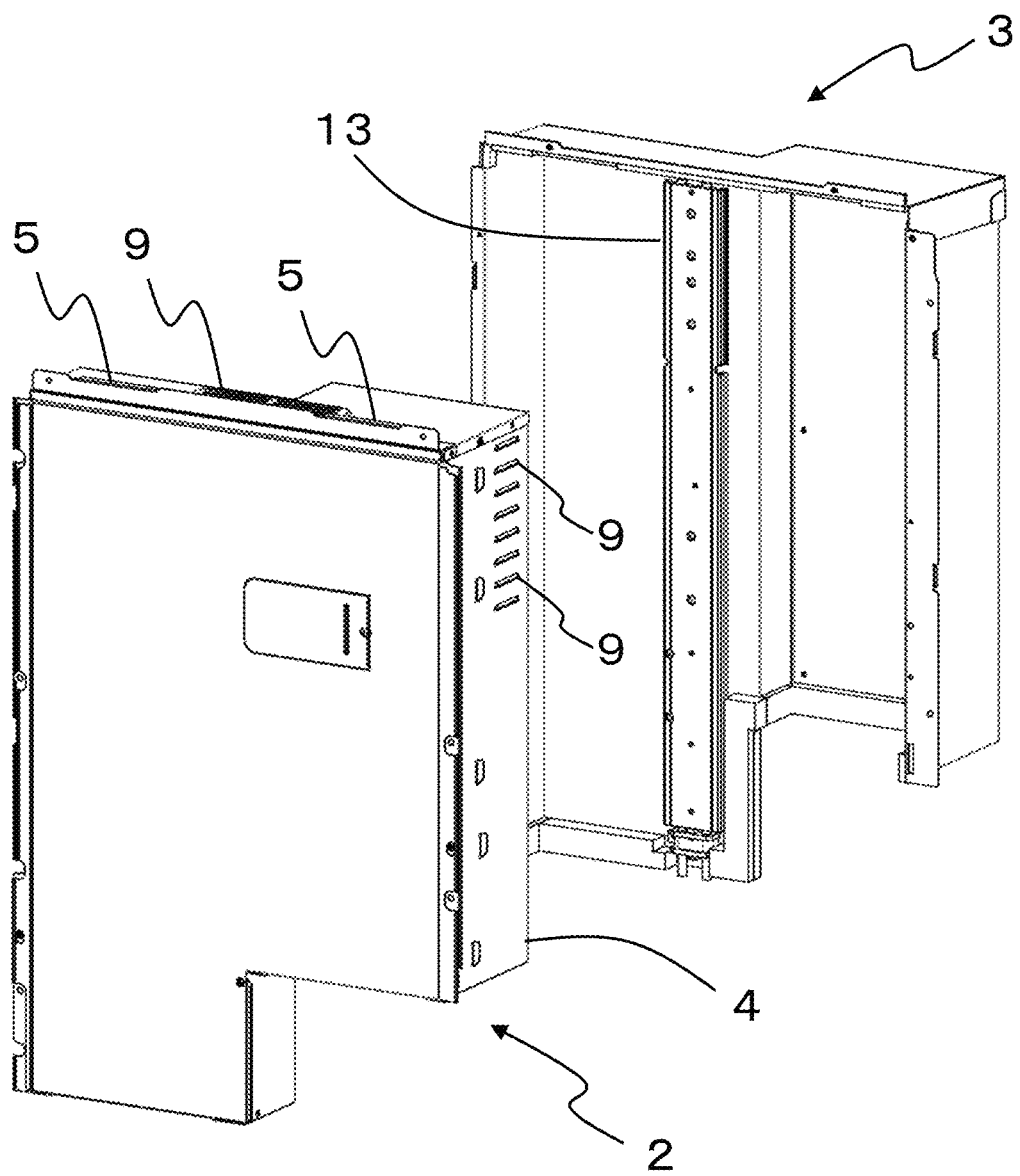
FIG. 2 is a diagram schematically illustrating configurations of an electrical component box and a waterproof cover.
Figure 3:
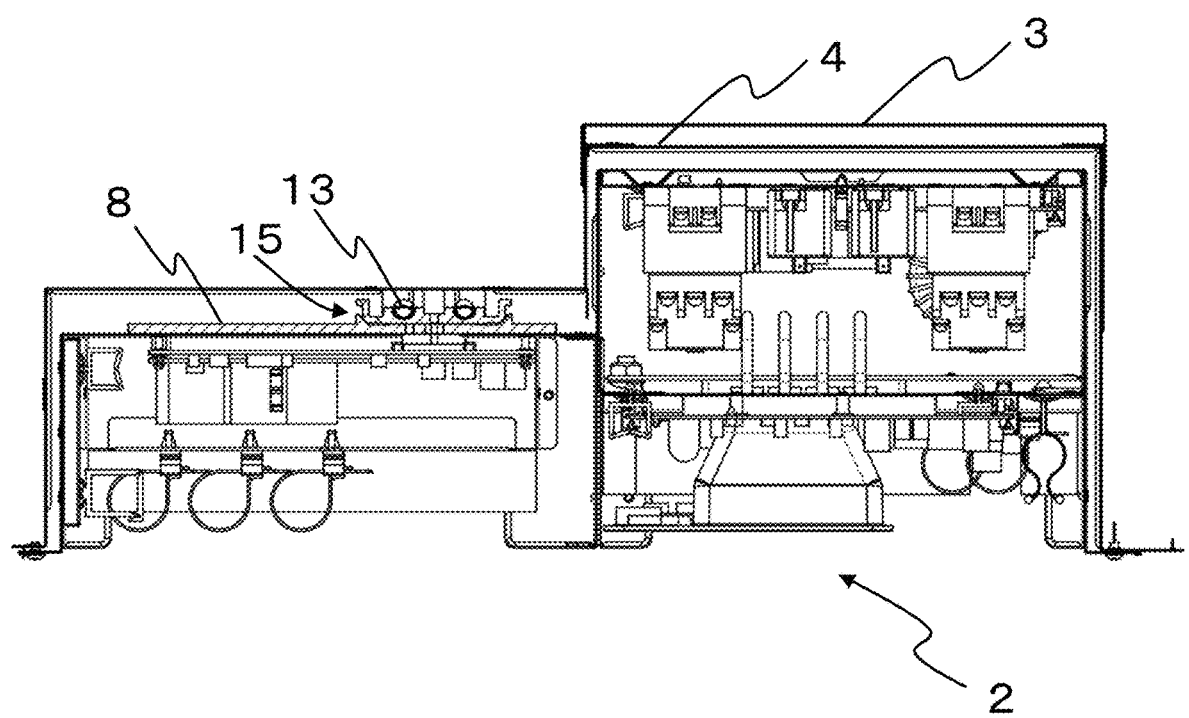
FIG. 3 is a diagram schematically illustrating a state where the electrical component box is accommodated in the waterproof cover.

The electrical component box 2 includes a casing 4 formed of sheet metal into a substantially box shape as illustrated in FIGS. 2 and 3, and various electrical components that configure a control circuit, a drive circuit, and the like are accommodated therein. In a case of the present embodiment, the electrical component box 2 is formed into an irregular shape that is relatively short in the vertical direction on the right side in a front view, is relatively long in the vertical direction on the left side, is relatively long in terms of the depth on the right side, and is relatively short in terms of the depth on the left side. Moreover, the electrical component box 2 in the present embodiment is formed into a state where the lower surface is open.

Additionally, the electrical component box 2 is provided with a claw portion 5 that is folded backward to be used for assembly with the outdoor unit 1. The claw portion 5 suspends and supports the electrical component box 2 in a temporary attachment state by being hooked in a claw engagement hole 6 that is a structure for attachment provided on the side of the outdoor unit 1 as will be described later in detail in the second embodiment. Also, a folded portion 7 bent in the direction opposite to the claw portion 5 is formed at the distal end of the claw portion 5 to reduce the concern that the hooked claw portion 5 comes off when the electrical component box 2 swings back and forth.

In addition, the back surface of the electrical component box 2 on the left side is in a state where it is blocked by a sub-heat sink 8 with heat conductivity. The sub-heat sink 8 is configured to be replaceable in accordance with the capability of the outdoor unit 1 as will be described later in detail in the third embodiment. Therefore, the entire sub-heat sink 8 can be attached to and detached from the casing 4 and is in a state where electrical components of different types and numbers are disposed in accordance with the capability of the outdoor unit 1.

Also, the electrical component box 2 is open and has an air inlet port on the lower end side and is provided with an air outlet port 9 on the upper end side. Therefore, in a case where electrical components generate heat during operation, air warmed inside the electrical component box 2 flows upward due to natural convection and is discharged to the outside. In the present embodiment, the outlet port 9 is provided on the upper end side of the upper surface and the right side surface of the electrical component box 2.

In addition, the electrical component box 2 is disposed in a state where the upper surface, the side surfaces, and the back surface thereof are covered with the waterproof cover 3 formed of sheet metal. In the case of the present embodiment, the waterproof cover 3 is formed to be longer than the height of the electrical component box 2, covers the entire upper surface, side surfaces, and back surface of the electrical component box 2, and is disposed in a state where a clearance from the electrical component box 2 is present in at least one of the upper surface, the side surfaces, and the back surface.

Figure 4:
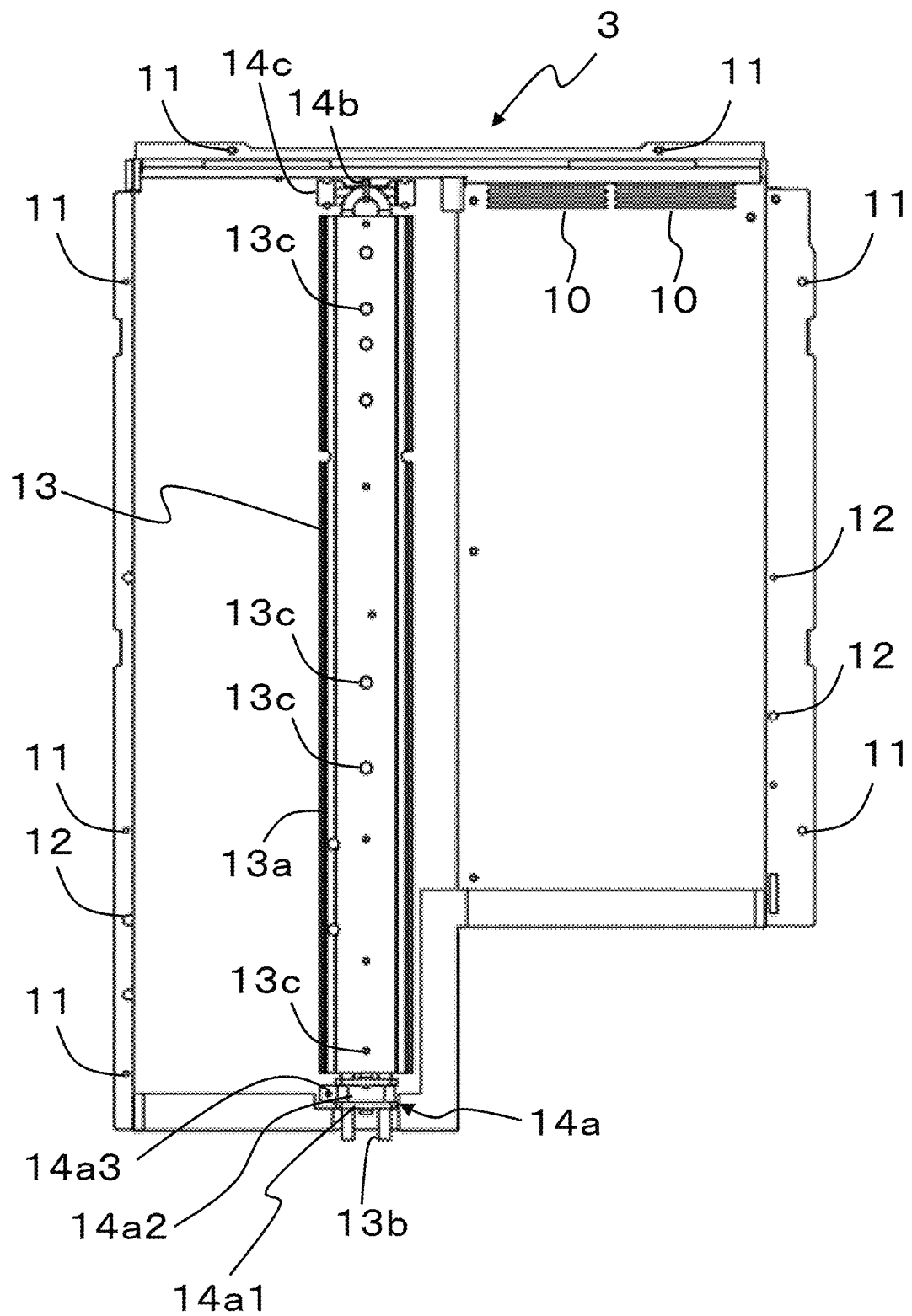
FIG. 4 is a diagram schematically illustrating an attachment state of a refrigerant cooling heat sink.

Therefore, even if water enters the inner surface side of the waterproof cover 3, adhesion thereof to the electrical component box 2 and invasion into the electrical component box 2 are curbed. Additionally, the waterproof cover 3 is provided with an exhaust port 10 in the back surface on the right side, for example, for discharging the air warmed inside the electrical component box 2 to the outside. Also, the waterproof cover 3 is provided with a plurality of fixing attachment holes 11 for fixing the waterproof cover 3 to the outdoor unit 1 and a plurality of component box attachment holes 12 used when the electrical component box 2 is attached as illustrated in FIG. 4. Note that the arrangement and the numbers of the fixing attachment holes 11 and the component box attachment holes 12 illustrated in FIG. 4 are examples.

Also, the electrical component box 2 is attached in a predetermined positional relationship relative to the waterproof cover 3 by using the component box attachment holes 12. In other words, the electrical component box 2 is fixed at a predetermined position of the outdoor unit 1 in a state where it is covered with the waterproof cover 3, the positional relationship with the waterproof cover 3 has been set, and it has been assembled at the end.

Also, the refrigerant cooling heat sink 13 is attached to the inner surface of the waterproof cover 3 on the side on which the electrical component box 2 is disposed in a positional relationship in which the refrigerant cooling heat sink 13 can come into contact with the sub-heat sink 8. Therefore, the relative positions between the electrical component box 2 and the refrigerant cooling heat sink 13 are also finally set by attaching the electrical component box 2 to the waterproof cover 3 as will be described later.

The refrigerant cooling heat sink 13 is configured of a main body portion 13a formed into a plate shape and a refrigerant pipe 13b through which a refrigerant flows as illustrated in FIG. 4, and the refrigerant cooling heat sink 13 is attached to the waterproof cover 3 in a state where the main body portion 13a is vertically long. The refrigerant pipe 13b is disposed in a state where it passes the rear surface of the main body portion 13a from the side below the main body portion 13a, projects from the upper end of the main body portion 13a, is then folded into a U shape, passes the back surface of the main body portion 13a again, and extends up to the side below the main body portion 13a in a state where the main body portion 13a is vertically disposed.

In addition, the refrigerant cooling heat sink 13 is attached to the waterproof cover 3 in a state where the refrigerant pipe 13b extending from the side below the main body portion 13a is attached to the waterproof cover 3 by an attachment member 14a and the refrigerant pipe 13b is temporarily attached at the part folded above the main body portion 13a with a temporary attachment member 14b which is a cable tie made of a resin. The attachment member 14a located below the refrigerant cooling heat sink 13 is configured of a holding member 14a1 made of rubber for holding the refrigerant pipe 13b and a cable tie 14a2 made of metal and wound around the outer periphery of the holding member, and the cable tie is attached to the waterproof cover 3 with a screw 14a3. On the other hand, the temporary attachment member 14b located above the refrigerant cooling heat sink 13 ties the attachment portion 14c provided at the waterproof cover 3 and the refrigerant pipe 13b together. Therefore, in a state where the main body portion 13a is attached to the waterproof cover 3, slight inclination and movement within a range of elasticity of rubber of the refrigerant pipe 13b and the attachment member 14a are allowed.

The main body portion 13a is provided with a plurality of screw holes 13c at the center portion in the width direction along the longitudinal direction. Also, the main body portion 13a is fixed to the electrical component box 2 by being screwed from the inside of the electrical component box 2 through the sub-heat sink 8 when the electrical component box 2 is attached to the waterproof cover 3. In other words, the main body portion 13a of the refrigerant cooling heat sink 13 is in a state where it is not directly fixed to the waterproof cover 3.

Figure 5:
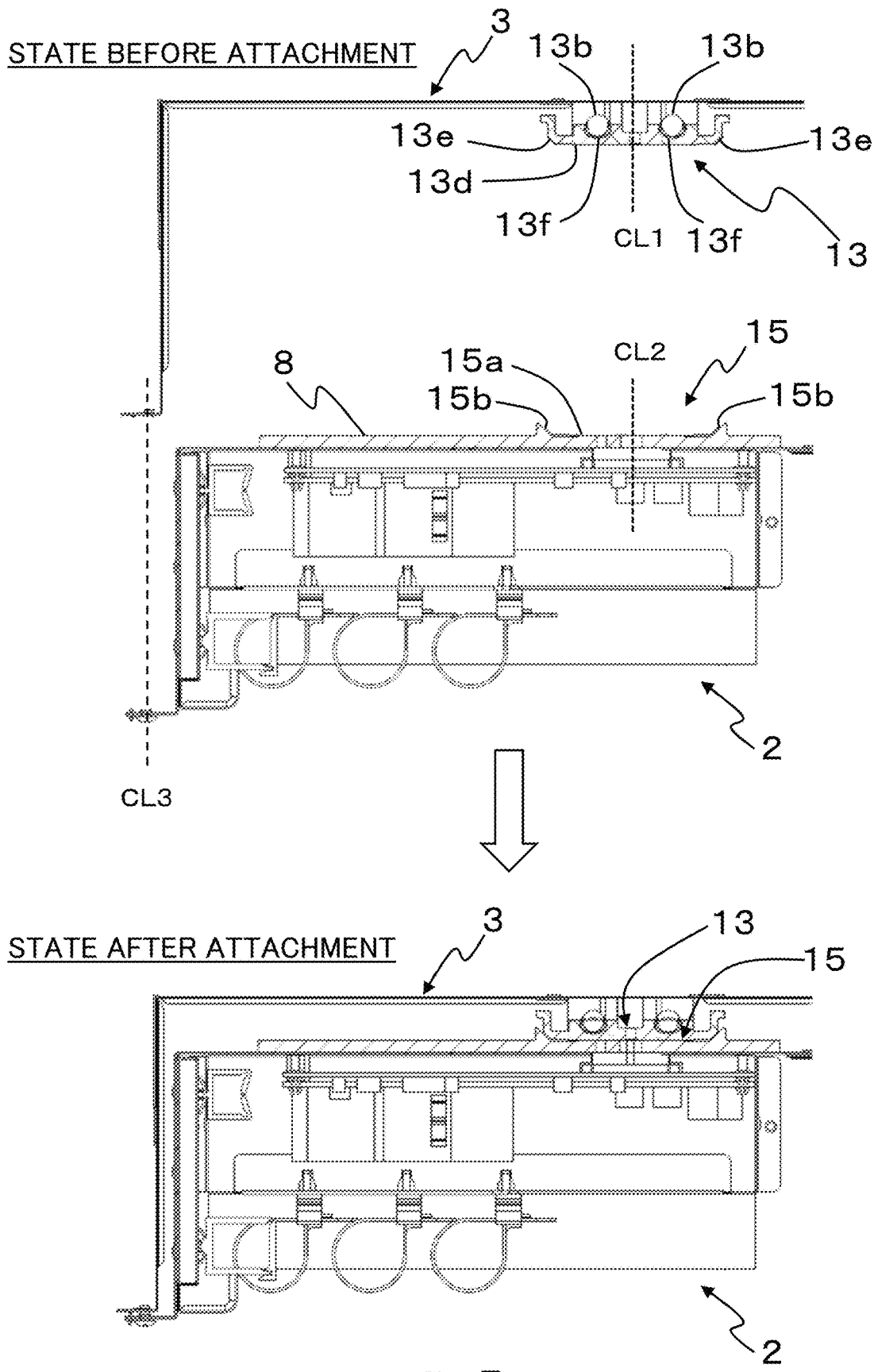
FIG. 5 is a diagram schematically illustrating alignment between the electrical component box and the refrigerant cooling heat sink.

Also, the main body portion 13a is provided with a flat portion 13d that is flat and comes into contact with the sub-heat sink 8 and chamfered portions 13e at both ends of the flat portion 13d in the width direction such that the chamfered portions 13e are inclined from the flat portion 13d on the side opposite to the side of the electrical component box 2 as illustrated in FIG. 5. Note that the refrigerant pipe 13b is fixed to the main body portion 13a by being fitted into a groove 13f provided in the longitudinal direction on the side opposite to the flat portion 13d. The main body portion 13a comes into contact with the guide portion 15 provided in the sub-heat sink 8 when the electrical component box 2 is assembled as illustrated in FIG. 5.

The guide portion 15 is provided behind the sub-heat sink 8 in the present embodiment and includes a contact surface 15a with which the refrigerant cooling heat sink 13 comes into contact and inclined surfaces 15b that rise at end portions of the contact surface 15a and are inclined toward the contact surface 15a. The inclined surfaces 15b are formed into a shape with an inclination angle that coincides with that of the chamfered portions 13e of the refrigerant cooling heat sink 13 within a predetermined precision range, and the chamfered portions 13e are also brought into a state where they are in contact with the inclined surfaces 15b in a state where the flat portion 13d is in contact with the contact surface 15a. It is thus possible to secure a larger contact area with the refrigerant cooling heat sink 13.

Incidentally, the electrical component box 2 is in a state where the rear surface side that comes into contact with the refrigerant cooling heat sink 13 is blocked by the sub-heat sink 8 as described above. Therefore, it is difficult to visually recognize the refrigerant cooling heat sink 13 from the front side when the electrical component box 2 is attached to the waterproof cover 3. Also, if the positional relationship with the refrigerant cooling heat sink 13 is not appropriately set, there is a concern that the contact area with the sub-heat sink 8 cannot be secured and cooling efficiency is degraded.

However, since the outdoor unit 1 is relatively large in practice, it is not easy to secure precision with which the casing 4 of the electrical component box 2 and the waterproof cover 3 can be positioned without providing so-called looseness. Therefore, it is difficult to precisely set their positional relationship simply by assembling the electrical component box 2. On the other hand, if it is attempted to obtain a state where the refrigerant cooling heat sink 13 is fixed in advance and to attach the electrical component box 2 thereto while positioning the electrical component box 2, there is a concern that it may be necessary to release the fixation of the refrigerant cooling heat sink 13 once, to adjust the position, and to attach it again in a case where the electrical component box 2 is displaced and this may lead to degradation of operation efficiency.

Furthermore, if it is attempted to attach the electrical component box 2 in a structure in which the refrigerant cooling heat sink 13 is not fixed, it is difficult to visually recognize the refrigerant cooling heat sink 13 as described above, and there is a concern that operation efficiency is degraded, for example, it takes time to achieve the attachment. Additionally, a space for enabling visual recognition of the refrigerant cooling heat sink 13 and enabling later fixation thereof is required, and there is a concern that arrangement of other components may be limited.

Thus, the main body portion 13a of the refrigerant cooling heat sink 13 is provided with the chamfered portions 13e, and the back surface of the electrical component box 2, that is, the part thereof which comes into contact with the main body portion 13a is provided with the guide portion 15 in the present embodiment. Thus, even if the center position of the refrigerant cooling heat sink 13 illustrated as the virtual line CL1 and the center position of the guide portion 15 illustrated as the virtual line CL2 slightly deviate from each other in the left-right direction in the drawing in the state before the electrical component box 2 is attached, the main body portion 13a is inclined along the inclined surfaces 15b and is then guided to the contact surface 15a side by attaching the electrical component box 2 in accordance with the component box attachment holes 12 as illustrated as the virtual line CL3 as illustrated in FIG. 5 as a state before attachment and a state after attachment.

Then, the inclination of the main body portion 13a is corrected by being screwed in order from the lower end side, and the main body portion 13a is fixed in a predetermined positional relationship with the guide portion 15 in a state where it is in close contact with the contact surface 15a. In this manner, the positional relationship between the main body portion 13a and the guide portion 15, that is, the relative positions of the electrical component box 2 and the refrigerant cooling heat sink 13 are set. In this case, it is possible to absorb deviation in the height direction with the main body portion 13a by causing the holes provided in the sub-heat sink 8 for insertion of the screws to be vertically long holes or have larger diameters than those of the screws.

In this manner, the electrical component box 2 and the refrigerant cooling heat sink 13 are positioned by attaching the electrical component box 2 to the waterproof cover 3, and the electrical component box 2 and the refrigerant cooling heat sink 13 are strictly positioned by screwing the main body portion 13a of the refrigerant cooling heat sink 13. In other words, it is possible to set the positional relationship between the refrigerant cooling heat sink 13 and the electrical component box 2 by providing the waterproof cover 3 and attaching the refrigerant cooling heat sink 13 to the waterproof cover 3.

According to the embodiment described above, the following advantages can be obtained.

The outdoor unit 1 of an air conditioner according to the embodiment includes the electrical component box 2 that is formed into a box shape, the waterproof cover 3 that covers the electrical component box 2, and the refrigerant cooling heat sink 13 that comes into contact with the back surface of the electrical component box 2. Additionally, the refrigerant cooling heat sink 13 is attached to the inner surface of the waterproof cover 3, the electrical component box 2 is attached to a predetermined position of the waterproof cover 3, and the relative position with the refrigerant cooling heat sink 13 is thereby set.

In this manner, it is possible to set the relative positions between the electrical component box 2 and the refrigerant cooling heat sink 13 even if the refrigerant cooling heat sink 13 is provided at a location where it is difficult to directly visually recognize the refrigerant cooling heat sink 13, by attaching the refrigerant cooling heat sink 13 to the waterproof cover 3 and attaching the electrical component box 2 to the waterproof cover 3.

Also, the electrical component box 2 is provided with the guide portion 15 on the side on which the refrigerant cooling heat sink 13 comes into contact, the guide portion 15 including the contact surface 15a with which the refrigerant cooling heat sink 13 comes into contact and the inclined surfaces 15b that rise from the end portions of the contact surface 15a and are inclined toward the contact surface 15a.

In this manner, the refrigerant cooling heat sink 13 is guided to the contact surface 15a side by the guide portion 15, comes into contact at an appropriate position, that is, on the contact surface 15a, and can secure cooling efficiency when the electrical component box 2 is attached to the waterproof cover 3.

Also, the refrigerant cooling heat sink 13 in the present embodiment includes the flat portion 13d that is formed into a plate shape and comes into contact with the contact surface 15a and the chamfered portions 13e that are provided at both ends of the flat portion 13d in the width direction. In this manner, the main body portion 13a is easily guided by the guide portion 15. At this time, contact is achieved between the chamfered portions 13e and the inclined surfaces 15b as well since the inclination of the chamfered portions 13e are caused to substantially coincide with that of the inclined surfaces 15b of the guide portion 15, and it is thus possible to improve cooling efficiency.

Also, the refrigerant cooling heat sink 13 includes the main body portion 13a that comes into contact with the electrical component box 2 and the refrigerant pipe 13b through which the refrigerant flows. Also, the refrigerant pipe 13b is fixed and thereby attached to the waterproof cover 3 by the attachment member 14a. It is thus possible to attach the refrigerant cooling heat sink 13 to the predetermined position of the waterproof cover 3 and to achieve an appropriate positional relationship with the electrical component box 2.

At this time, it is possible to achieve arrangement at the appropriate positions while correcting positional deviation and inclination of the main body portion 13a even in a case where the position of the main body portion 13a slightly deviates or the main body portion 13a is slightly inclined, by providing the screw holes in the main body portion 13a and performing screwing from the inside of the electrical component box 2 as in the present embodiment.

Also, the structure in which the main body portion 13a of the refrigerant cooling heat sink 13 is not directly fixed to the waterproof cover 3 is adopted. It is thus possible to curb transmission of vibration from the compressor and the like during operation to the electrical component box 2.

Also, the electrical component box 2 is covered in a state where a clearance from the inner surface of the waterproof cover 3 is present. It is thus possible to curb invasion of water into the electrical component box 2 even in a case where water enters the inner surface of the waterproof cover 3.

Second Embodiment

Hereinafter, the second embodiment will be described. In the second embodiment, details of the structure of the waterproof cover 3 will be described. The waterproof cover 3 covers the upper surface, the side surfaces, and the back surface of the electrical component box 2 formed into a box shape as described in the first embodiment and thereby protects the electrical component box 2 from invasion of water.

At this time, other components and pipes are disposed on sides of the side surfaces and the back surfaces of the electrical component box 2 and the waterproof cover 3 in the surroundings thereof as described in the first embodiment. Also, since it is necessary to dispose the electrical component box 2 in a state where it comes into contact with the refrigerant cooling heat sink 13, it is necessary to mount the waterproof cover 3 between the refrigerant cooling heat sink 13 and other components or pipes in a case where the waterproof cover 3 is disposed.

However, since the waterproof cover 3 is formed into a shape capable of accommodating the electrical component box 2 although it is open on the front side as illustrated in FIG. 2, it is difficult to dispose the waterproof cover 3 between the refrigerant cooling heat sink 13 and other components without any change in the shape thereof. Also, in a case where the waterproof cover 3 has a shape capable of accommodating the electrical component box 2, the upper side, the left side, and the right side of the refrigerant cooling heat sink 13 are blocked, and it is thus difficult to attach the refrigerant cooling heat sink 13 after mounting the waterproof cover 3.

Figure 6:
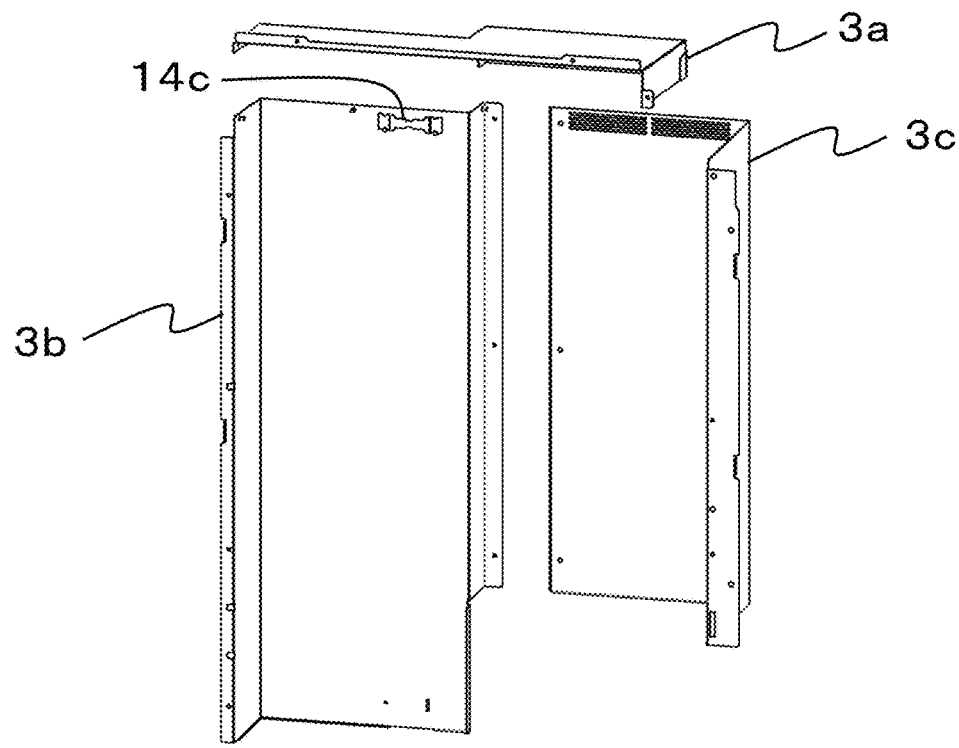
FIG. 6 is a diagram schematically illustrating a configuration of a waterproof cover according to a second embodiment.
Figure 6:
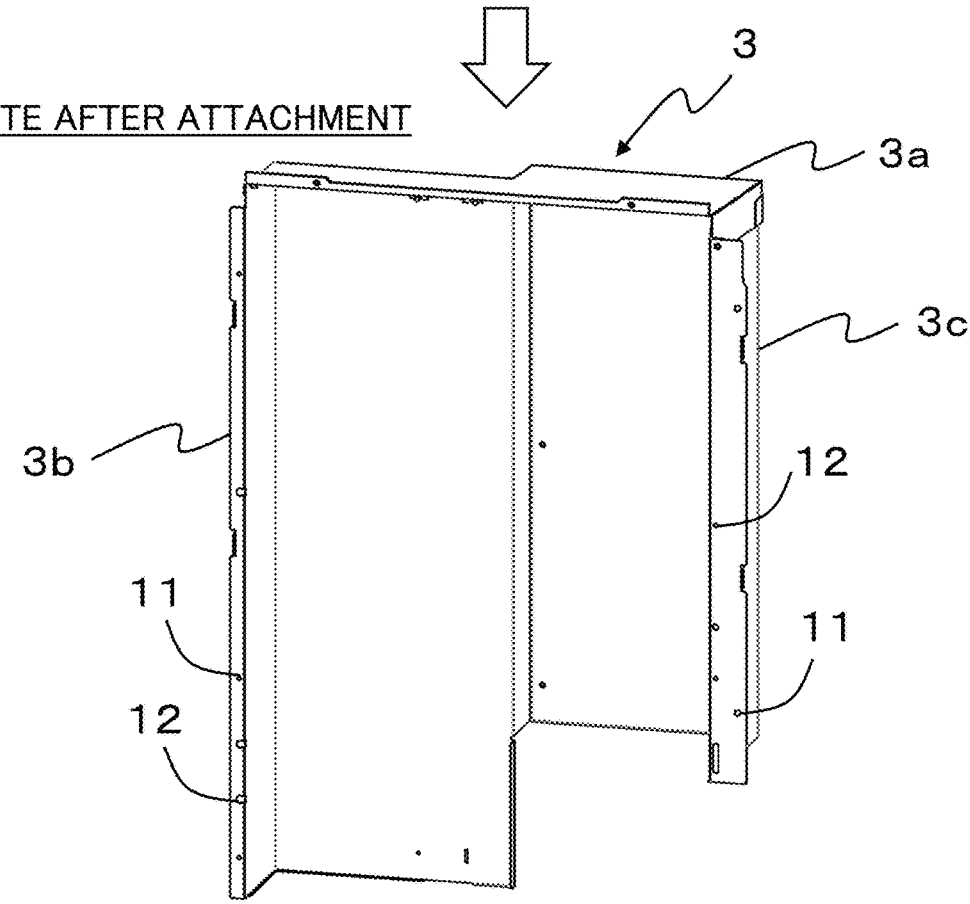

Thus, the waterproof cover 3 in the present embodiment is configured of a top plate 3a that covers the upper surface of the electrical component box 2, a left side plate 3b that covers a part from the left side surface to a portion of the back surface of the electrical component box 2, and a right side plate 3c that covers a part from the right side surface to a portion of the back surface of the electrical component box 2 as illustrated in FIG. 6 as a state before assembly. In other words, the waterproof cover 3 can be split and assembled. At this time, all the plates are formed of sheet metal.

Figure 7:
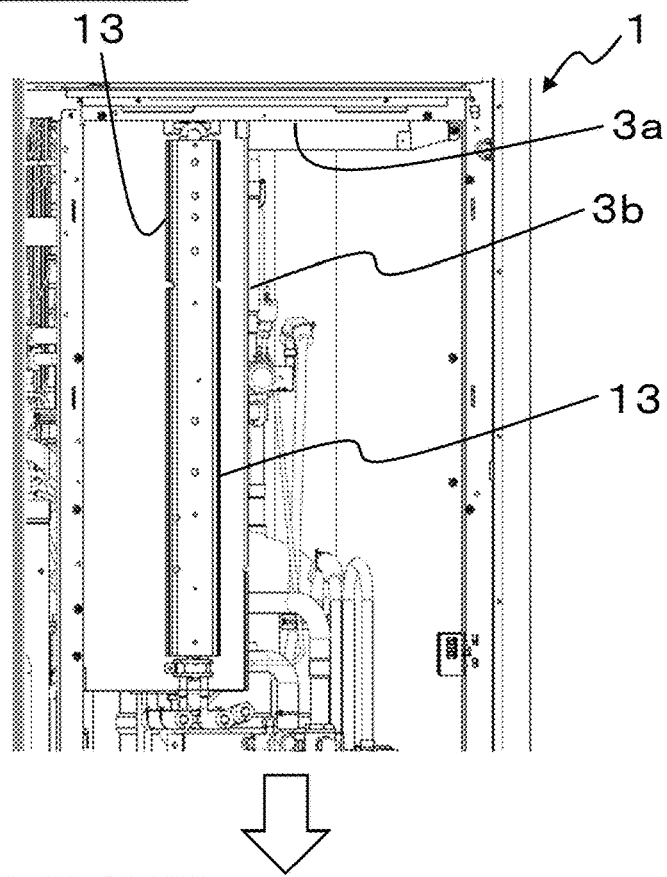
FIG. 7 is a diagram schematically illustrating an assembly mode of the waterproof cover.
Figure 7:
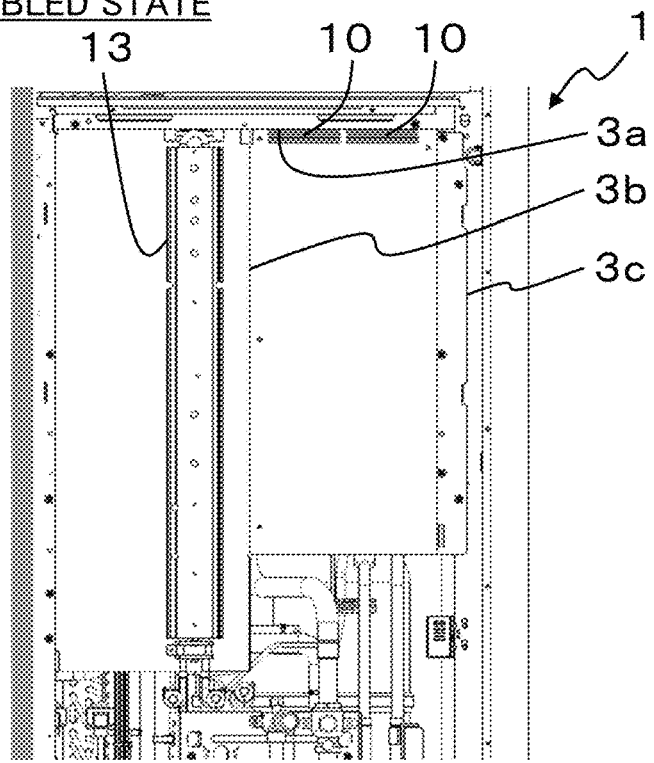

Also, the waterproof cover 3 is attached and fixed to the outdoor unit 1 with the left side plate 3b inserted between the refrigerant cooling heat sink 13 and other components as illustrated in FIG. 7 as a left side assembled state in a state where the top plate 3a and the left side plate 3b have been assembled in advance, that is, in a state where the right part of the waterproof cover 3 is open at the time of the assembly. Thereafter, the right side plate 3c is fixed to the top plate 3a and the left side plate 3b as illustrated in FIG. 7 as the right side assembled state. It is thus possible to easily assemble the waterproof cover 3 in the state where the left side plate 3b is disposed between the refrigerant cooling heat sink 13 and other components.

Incidentally, the end portions of the waterproof cover 3 on the sides of the side surface and the back surface of the top plate 3a are folded downward, and the upper ends of the left side plate 3b and the right side plate 3c are in a state where they are covered with the top plate 3a from the outside in a state where the left side plate 3b and the right side plate 3c are assembled. Also, the top plate 3a is inclined toward the back surface such that water dropping to the top plate 3a flows to the back surface side. In this manner, flowing of water to the front surface side on which the opening is provided is curbed even if water drops to the top plate 3a.

Figure 8:
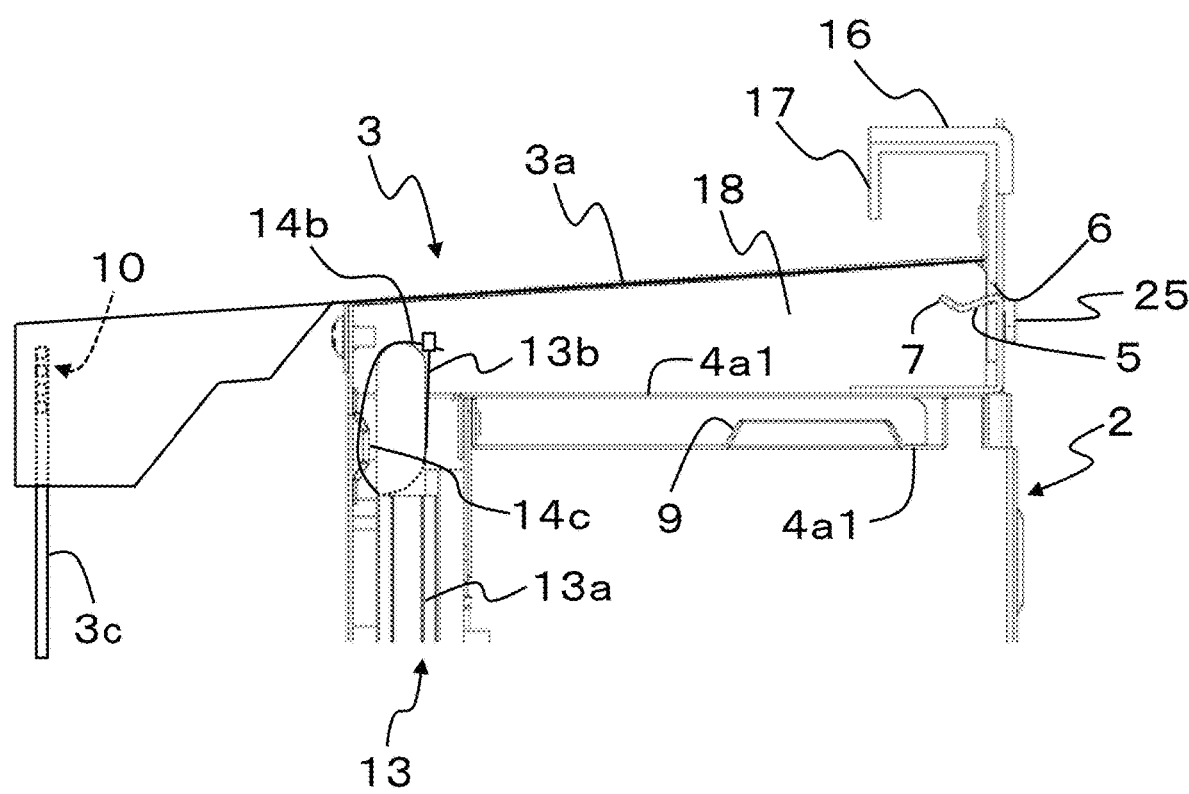
FIG. 8 is a diagram schematically illustrating an attachment state on an upper end side of an electrical component box.

Also, although the exhaust port 10 is provided on the upper end side of the right side plate 3c in the present embodiment, the exhaust port 10 is covered from the outside in a state where a clearance from the exhaust port 10 intervenes by folding downward the end portion of the top plate 3a on the back surface side at the position separated from the exhaust port 10 as illustrated in a sectional view in FIG. 8. In this manner, invasion of water from the exhaust port 10 is curbed while allowing exhaust from the inside of the waterproof cover 3.

Also, both fixing attachment holes 11 for fixing the waterproof cover 3 to the outdoor unit 1 and the left and right attachment holes for fixing the left side plate 3b and the right side plate 3c are provided at positions at which it is possible to perform screwing from the front side. In this manner, it is possible to perform the screwing operation from the front side when the waterproof cover 3 is fixed to the outdoor unit 1 and when the right side plate 3c is fixed after the assembly in the split state, and it is possible to significantly enhance operability.

In this case, the fixing attachment holes 11 can be holes for insertion of the screws or can be so-called screw holes with screw grooves formed therein in accordance with attachment positions or parts. In the case of the present embodiment, for example, the fixing attachment holes 11 for fixing the top plate 3a are formed of screw holes, and the fixing attachment holes 11 for fixing the left side plate 3b and the right side plate 3c are formed of holes for insertion of the screws.

Also, the fixing attachment holes 11 are provided at sealing structure parts formed by folding front ends of the top plate 3a, the left side plate 3b, and the right side plate 3c in a flange shape. For the top plate 3a, for example, the front end of the top plate 3a is folded upward to form a sealing structure part, and the top plate 3a is fixed, from the rear surface side, to an angle member 17 attached to a beam 16 as a structure at the part as illustrated in FIG. 8. Note that the fixation itself can be performed from the front side. It is possible to curb invasion of water into the inner surface of the waterproof cover 3 even in a case where the fixing attachment holes 11 penetrating from the front surface to the rear surface of each plate are provided, by providing the fixing attachment holes 11 at the sealing structure part in this manner.

Similarly, the left side plate 3b and the right side plate 3c are also fixed to the structure of the outdoor unit 1 at the sealing structure part. Furthermore, the left side plate 3b and the right side plate 3c are assembled in a state where mutual end portions overlap each other on the back surface side and are screwed at the mutually overlapping part. It is thus possible to curb invasion of water from between the left side plate 3b and the right side plate 3c. In other words, the part where the left side plate 3b and the right side plate 3c overlap each other serves as the sealing structure part and curbs invasion of water.

Incidentally, the electrical component box 2 can also be screw-fixed from the front side in order to enhance operability in the present embodiment. In that case, there is a concern of permeation of water into the hole portions for insertion of the screws and screw holes. Thus, the electrical component box 2 is provided with a hole portion for fixing the upper end side to a duct portion 18 formed between the upper surface of the electrical component box 2 and the top plate 3a and is fixed with a fixing tool 25 such as a screw and a bolt, for example. The duct portion 18 is a part through which air ejected from the outlet port 9 of the electrical component box 2 flows up to the exhaust port 10 of the waterproof cover 3.

At this time, the top plate 3a forming the ceiling of the duct portion 18 is provided to be inclined toward the back surface with the front end thereof folded upward to serve as the sealing structure part. Therefore, flowing of water to the front side is curbed even if water drops to the top plate 3a. In this manner, it is possible to curb invasion of water into the electrical component box 2 by setting the position where the upper end side of the electrical component box 2 is fixed at a position, at which the upper side thereof is covered with the top plate 3a, outside the electrical component box 2.

Also, since the outlet port 9 provided in the upper surface of the electrical component box 2 is provided in an aspect in which it projects upward from the upper surface, invasion of water from the outlet port 9 into the electrical component box 2 is curbed even if water enters the upper surface of the electrical component box 2. Also, the exhaust port 10 provided in the waterproof cover 3 is covered with an eaves portion obtained by folding downward the end portion of the top plate 3a on the back surface side from the outside thereof in a state where a clearance is present away therefrom. It is thus possible to curb accumulation of air warmed by heat generated by the electrical components in the waterproof cover 3 and to curb invasion of water from the exhaust port 10.

According to the embodiment described above, the following advantages can be obtained.

The outdoor unit 1 includes the electrical component box 2 that is formed into the box shape and the waterproof cover 3 that covers the electrical component box 2. Also, the waterproof cover 3 is configured of the top plate 3a that covers the upper surface of the electrical component box 2, the left side plate 3b that covers a part from the left side surface to a portion of the back surface of the electrical component box 2, and the right side plate 3c that covers a part from the right side surface to a portion of the back surface of the electrical component box 2 and can be split and assembled.

In this manner, it is possible to split the waterproof cover 3 into each plate and then assemble in a case where the waterproof cover 3 disposed in the mode in which it covers the electrical component box 2 is provided, and it is possible to easily assemble the waterproof cover 3 even at a location where other components configuring the refrigerating cycle, for example, are disposed in the surroundings.

Also, the top plate 3a, the left side plate 3b, and the right side plate 3c of the waterproof cover 3 can be individually attached to the outdoor unit 1. It is thus possible to adopt an assembly procedure that is appropriate in terms of the space and the like that are available when the waterproof cover 3 is attached and operability. It is possible to perform the attachment and the assembly in a procedure in which operations can be easily performed, and for example, it is possible to assemble the top plate 3a and the left side plate 3b in advance and then attach them to the outdoor unit 1 as illustrated as an example in the embodiment, or it is possible to attach the top plate 3a in advance and then attach the left side plate 3b and the right side plate 3c.

Also, the left side plate 3b and the right side plate 3c of the waterproof cover 3 can be assembled in a state where the end portions thereof overlap each other on the back surface side. Although a clearance occurs between the plates of the waterproof cover 3 due to the split structure unlike the integrated configuration, it is possible to achieve sealing between the left side plate 3b and the right side plate 3c and to curb invasion of water into the waterproof cover 3 by enabling the assembly into the state where the end portions thereof overlap each other. At this time, it is also possible to curb invasion of water from the upper side by folding the end portion of the top plate 3a and covering the upper ends of the left side plate 3b and the right side plate 3c as in the embodiment.

Also, the duct portion 18 through which the air ejected from the electrical component box 2 flows is formed between the electrical component box 2 and the waterproof cover 3, and the screw position for attachment of the waterproof cover 3 to the outdoor unit 1 is set inside the duct portion 18. In this manner, it is possible to curb invasion of water into the electrical component box 2 and to significantly improve operability of the assembly since the screwing can be performed from the front side even in a case where the structure of screwing the electrical component box 2 from the front side is adopted.

Also, the exhaust port 10 is provided on the upper end side of at least one of the left side plate 3b and the right side plate 3c, and the exhaust port 10 is covered with the eaves portion formed by folding downward the end portion of the top plate 3a from the outside in the state where a clearance intervenes. It is possible to curb heat discharge inside the waterproof cover 3 and invasion of water from the exhaust port 10.

Third Embodiment

Hereinafter, the third embodiment will be described. In the third embodiment, details of the electrical component box 2 will be described. The outdoor unit 1 may be manufactured as a series of product group in which internal components are replaced in a case where the same outer shape has different cooling capability, for example. In such a case, the number and the types of electrical components to be accommodated in the electrical component box 2 are different in accordance with the required capability, the number of fan devices required for the capability, and the like. Also, the positions where the electrical components are to be mounted may be different in accordance with the required capability, the number of fan devices required for the capability, and the like.

Therefore, since it is necessary not to provide unnecessary hole portions in order to curb invasion of water in the related art, the outdoor unit 1 is individually designed to mount only necessary electrical components each time even in the case of the manufacturing as a series. This results in an increase in number of components and molds for sheet metal even for the series product. Also, the situation has become significant with an effort to enrich the product lineup.

On the other hand, it is not desirable to adopt a common design in which a large number of component attachment holes for attachment of components are provided in advance in the electrical component box 2. This is because the common design may lead to formation of unnecessary holes depending on the product and promote invasion of water since some electrical components to be mounted may have weights to some extent and through holes are needed to reliably fix the electrical components.

In other words, it is necessary to solve the problem that different component attachment holes are needed in accordance with capability of the air conditioner, which is inconsistent with the common design, in order to share components and molds for the electrical component box 2. Thus, the components and the molds needed for the electrical component box 2 are shared in the outdoor unit 1 as a series of product group with the same outer shape as follows in the present embodiment.

In the case of the outdoor unit 1, it is possible to consider that the mechanical structure thereof is shared. In other words, it is possible to consider that a space for allowing arrangement of the electrical component box 2 capable of accommodating the electrical component needed at the time of maximum capability is secured in the outdoor unit 1. In other words, it is possible to consider that the size of the casing 4 of the electrical component box 2 can be the same size regardless of the capability.

Also, it is possible to consider that the electrical components to be accommodated in the electrical component box 2 include common components that are common regardless of the capability of the air conditioner and specific components that are different in accordance with the capability of the air conditioner. For example, it is considered that a control circuit, a noise filter circuit, an external interface circuit, a thermistor circuit, a magnet switch circuit, and a substrate including the circuits mounted thereon are commonly used regardless of the capability of the air conditioner.

On the other hand, it is considered that a drive circuit of the fan device, a drive circuit of the compressor, a rectifier circuit, and a substrate with the circuits mounted thereon, for example, of different types and numbers are used in accordance with the capability of the air conditioner. Therefore, it is considered to be possible to share the casing 4 as long as it is possible to enable replacement of the specific components in accordance with the capability of the air conditioner.

Figure 9:
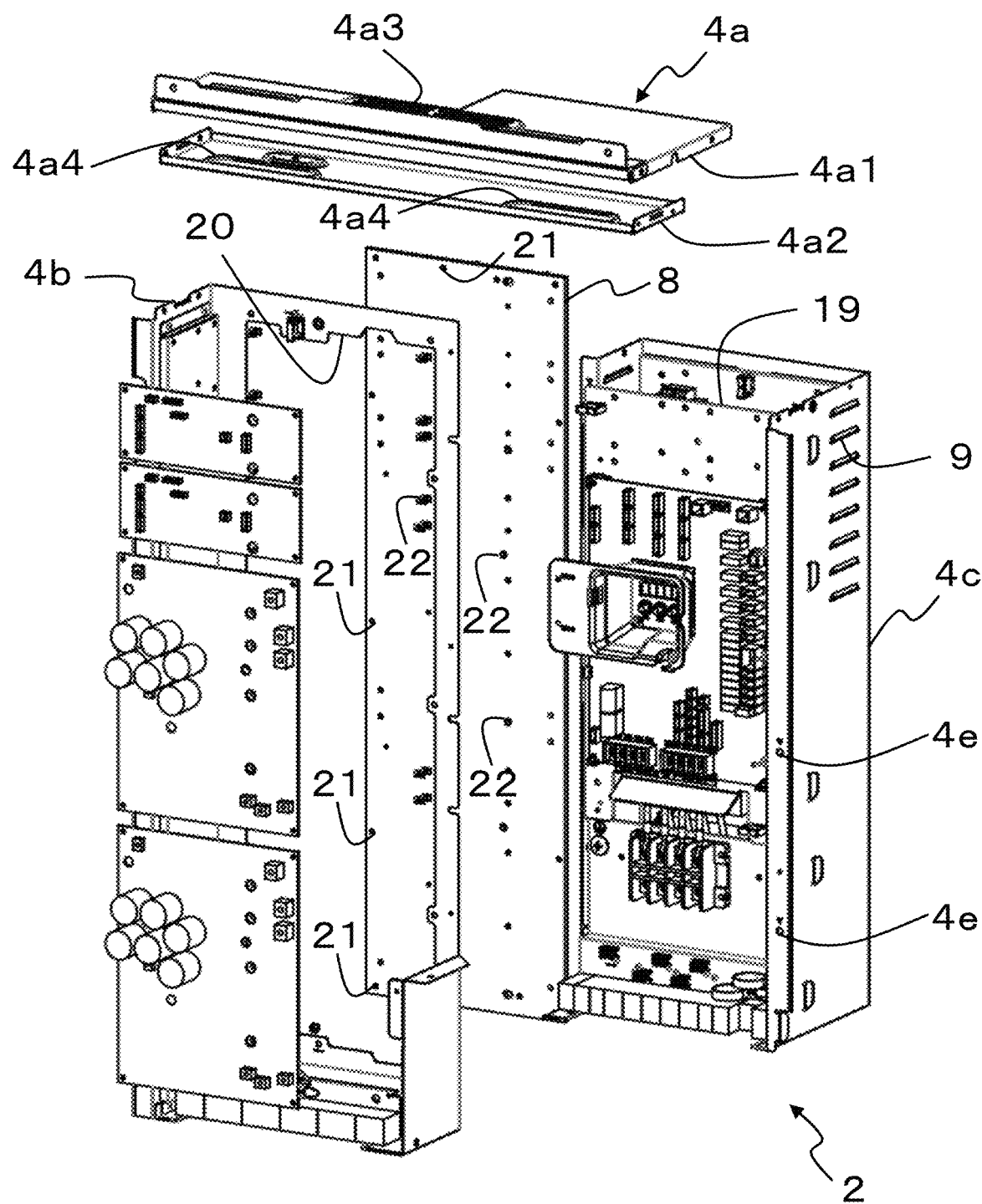
FIG. 9 is a diagram schematically illustrating a configuration of an electrical component box according to a third embodiment.

Thus, the casing 4 of the electrical component box 2 is formed of sheet metal and is formed of an upper surface plate 4a that forms the upper surface of the electrical component box 2, a left side surface plate 4b that forms a part from the left side surface to a portion of the back surface of the electrical component box 2, and a right side surface plate 4c that forms a part from the right side surface to a portion of the back surface of the electrical component box 2, as illustrated in the exploded perspective view in FIG. 9 in the present embodiment.

Hereinafter, the space surrounded by the left side surface plate 4b will be referred to as an internal space on the left side, and the space surrounded by the right side surface plate 4c will be referred to as an internal space on the right side, in the internal space of the electrical component box 2 for convenience.

The upper surface plate 4a has a double-plate structure formed of an outer plate 4a1 that is formed into a size with which the entire upper surface of the electrical component box 2 in FIG. 3 is covered and an inner plate 4a2 that is disposed inside the outer plate 4a1 and is formed into a size with which a substantially lower half illustrated in FIG. 3 is covered. An outer opening 4a3 is provided in the outer plate 4a1 in an aspect in which it is located at substantially the center in the width direction and projects upward from the upper surface, and two inner openings 4a4 are provided in the inner plate 4a2 in a mode in which they are located at positions deviating from the outer opening 4a3 above the inner space on the left side and above the inner space on the right side and project upward from the upper surface. The outer opening 4a3 and the inner openings 4a4 form the outlet ports 9 from which the air from the inside of the electrical component box 2 is ejected.

Also, in the case of the present embodiment, the inner opening 4a4 in the inner space on the right side is provided to be located on the side further forward than the substrate attachment plate 19 in an aspect of sectioning the internal space on the front and back sides, and the outlet port 9 is provided on the side surface side on the side further backward than the substrate attachment plate 19. In this manner, it is possible to efficiently eject the entire air in the internal space even in the case where the substrate attachment plate 19 is provided to section the internal space on the right side.

The right side surface plate 4c is formed into a shape that reaches the left side surface plate 4b on the back surface side while surrounding the internal space on the right side with a relatively large depth, and the outlet port 9 is provided on the upper end side of the right side surface in the present embodiment. Also, the front end side of the right side surface plate 4c serves as a sealing structure part folded outward, and the component box attachment hole 4e is formed at the sealing structure part. Therefore, even if the component box attachment hole 4e penetrating through the sealing structure part is provided, forward advancing of water droplets and then invasion into the electrical component box 2 are curbed when the water droplets adhere to the side surfaces of the electrical component box 2. Note that although illustration is omitted, the left side surface plate 4b also has a similar structure.

The left side surface plate 4b is formed into a shape that reaches the right side surface plate 4c while surrounding the internal space on the left side and is connected to the right side surface plate 4c on the back surface side. At this time, the left side surface plate 4b is connected at the sealing structure part obtained by folding outward the front end of the right side surface plate 4c on the side of the left side surface plate 4b. Therefore, invasion of rain water from the connecting portion between the left side surface plate 4b and the right side surface plate 4c into the electrical component box 2 is curbed.

Also, the left side surface plate 4b is formed into a frame shape having a large opening part 20 on the back surface side thereof, and the sub-heat sink 8 is detachably fixed to the frame part in an aspect in which it blocks the opening part 20. The sub-heat sink 8 is formed into a plate shape and is provided with a plurality of fixing hole portions 21 for fixation to the left side surface plate 4b and a plurality of mounting hole portions 22 for attachment of different electrical components in accordance with the capability of the air conditioner. Note that the illustrated positions and numbers of the fixing hole portions 21 and mounting hole portions 22 are examples.

At this time, the fixing hole portion 21 in the left side surface plate 4b is provided at a common position regardless of the capability of the air conditioner. In other words, the left side surface plate 4b allows attachment of another sub-heat sink 8 with different electrical components mounted thereon without changing the size of the casing 4. In this manner, a sub-heat sink 8 in accordance with the capability of the air conditioner can be selected and attached to the electrical component box 2, and it is possible to commonly use the casing 4.

Also, the sub-heat sink 8 is provided with the mounting hole portions 22 at positions where the electrical components needed in accordance with the capability of the air conditioner are mounted. In other words, the sub-heat sink 8 has a structure in which the mounting hole portions 22 for mounting electrical components needed for certain capability are formed at their specific positions and hole portions that are not necessary for the capability are not provided.

Figure 10:
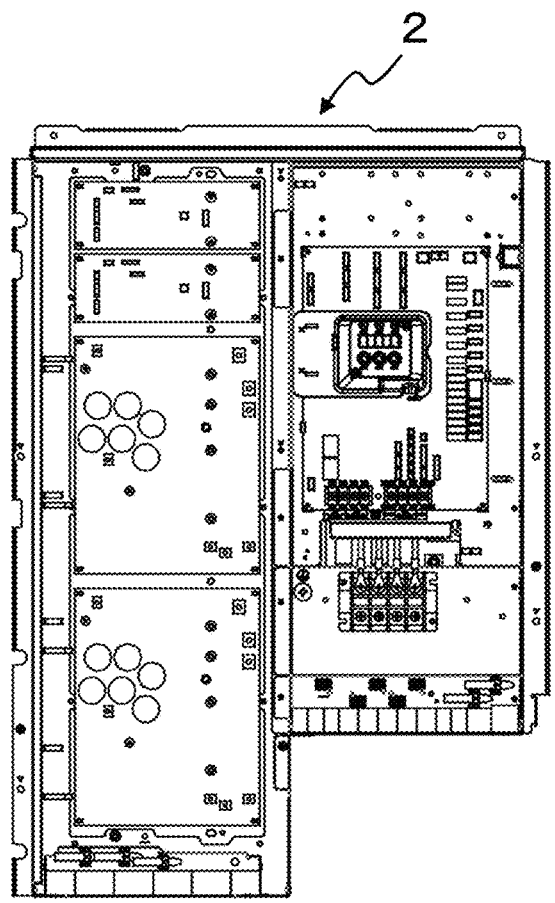
FIG. 10 is a diagram schematically illustrating an implementation mode of electrical components in a case of different capability.
Figure 10:
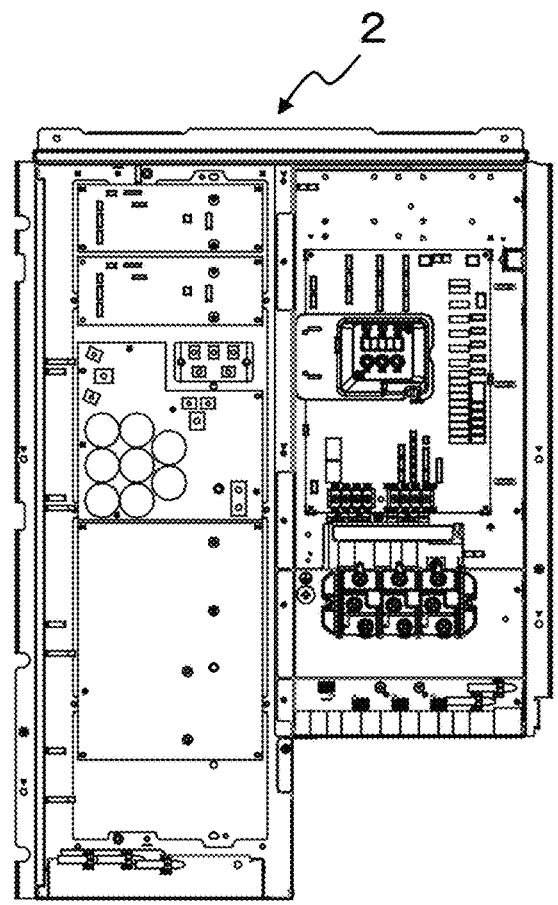

Also, it is possible to dispose the electrical components in accordance with the capability of the air conditioner by mounting the aforementioned specific components on the sub-heat sink 8, sharing the casing 4 with the same size and structure, and replacing the electrical components and circuit substrates for each sub-heat sink 8 as illustrated as a high-power type and a medium-power type in FIG. 10. Note that the high-power type and the medium-power type mean a product of relatively high output and a product of relatively low output in the series.

Also, although specific components are mainly mounted on the sub-heat sink 8, it is also possible to mount common components thereon. In other words, not only the specific components are mounted on the sub-heat sink 8. In the example in FIG. 10, for example, the two drive circuit substrates are mounted on the outdoor unit 1 of the high-power type since two fan devices are provided while there may be a case where one fan device is provided for a low output type and one drive circuit substrate is mounted in such a case. Therefore, although it is possible to state that the one fan device is a common component since it is used regardless of the capability, it is mounted on the sub-heat sink 8 in the present embodiment.

In the present embodiment, the aforementioned guide portion 15 is provided in the back surface of the sub-heat sink 8 and comes into contact with the refrigerant cooling heat sink 13 in a state where the electrical component box 2 is accommodated. Therefore, components with relatively large amounts of heat generation from among the electrical components to be mounted on the sub-heat sink 8 are disposed to be vertically aligned along the refrigerant cooling heat sink 13. It is thus possible to efficiently cool the electrical components and to curb a temperature rise inside the electrical component box 2.

Note that where the common components and the specific components are to be mounted can be appropriately designed, and components of different types in accordance with the capability of the air conditioner are mounted on the sub-heat sink 8, and for example, electrical components with large amounts of heat generation are mounted on the sub-heat sink 8 on which they can be cooled by the refrigerant cooling heat sink 13.

In this manner, it is only necessary to attach the sub-heat sink 8 to the electrical component box 2 in the present embodiment in accordance with the capability of the air conditioner each time, and it is possible to share the casing 4 and to accommodate electrical components of different types and numbers without providing unnecessary hole portions.

Figure 11:
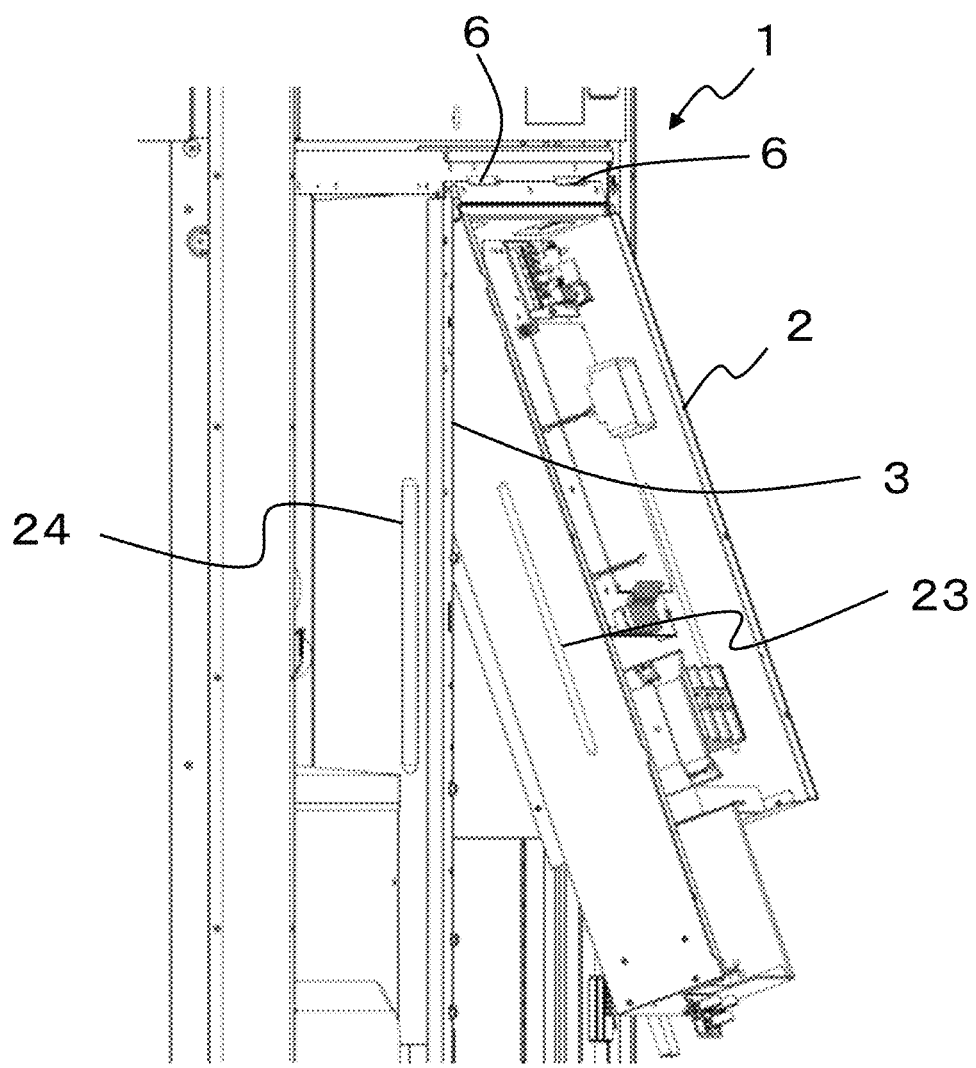
FIG. 11 is a diagram schematically illustrating an assembly mode of the electrical component box.

Incidentally, such an electrical component box 2 is disposed in a state where it is covered with the waterproof cover 3. In such a case, the electrical component box 2 is assembled with the outdoor unit 1 by hooking the claw portion 5 in the claw engagement hole 6 to achieve a suspended state on the upper end side and by pushing the lower end side backward as illustrated in FIG. 11. At this time, although the concern of coming off is reduced by the folded portion 7 in the state where the upper end side is suspended while the electrical component box 2 requires alignment with the refrigerant cooling heat sink 13 and the waterproof cover 3 as described above, there is a concern of deterioration of operability and degradation of operator's safety due to the electrical component box 2 swinging back and forth.

Thus, the side surface of the electrical component box 2 in the present embodiment is provided with a box-side projecting portion 23 that is formed to extend in the up-down direction and projects outward from the side surface, and the waterproof cover 3 is provided with a cover-side projecting portion 24 that is formed to extend in the up-down direction and projects inward, that is, on the side of the electrical component box 2 from the inner surface. Each projecting portion is provided without any need of an additional component by drawing the left side surface plate 4b of the electrical component box 2 or the left side plate 3b of the waterproof cover 3 formed of sheet metal.

Also, each projecting portion are disposed in a state where it does not extend up to the upper ends and the lower ends of the electrical component box 2 and the waterproof cover 3 and is not connected to the front ends and the back ends. In other words, each projecting portion is provided at a position separated from edges of the surfaces in which each projecting surface is formed. In this manner, deflection occurs at each projecting portion, more strictly, the surface in which each projecting portion is provided when the electrical component box 2 is pushed in as will be described below.

Figure 12:
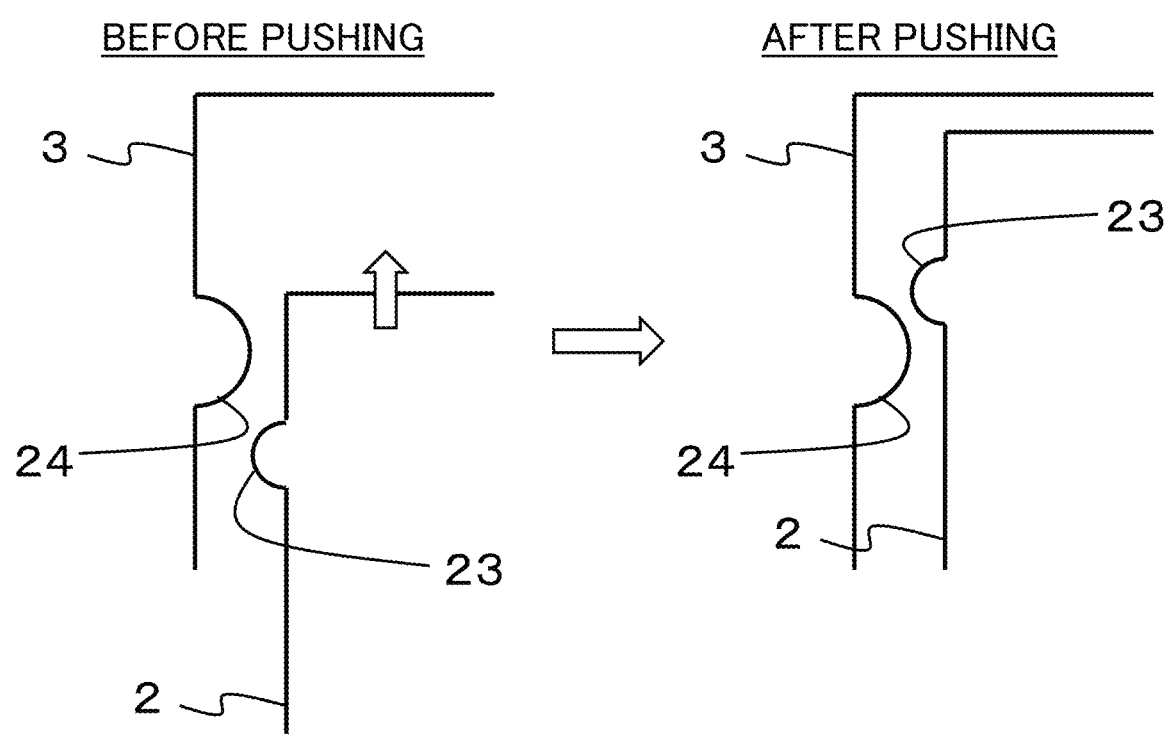
FIG. 12 is a diagram schematically illustrating a temporary attachment mode of the electrical components.

Then, forward movement of the electrical component box 2 is curbed by the box-side projecting portion 23 climbing over the cover-side projecting portion 24 when the electrical component box 2 is pushed into the waterproof cover 3 as illustrated in FIG. 12 as states before pushing and after pushing. Then, temporary fixation is achieved in this state, and it is thus possible to curb the electrical component box 2 swinging back and forth and to reduce the concern of the deterioration of operability and the degradation of operator's safety. Note that it is possible to adopt a configuration in which the box-side projecting portion 23 and the cover-side projecting portion 24 are provided in the configurations in the first embodiment and the second embodiment.

According to the embodiment described hitherto, the following advantages can be obtained.

The outdoor unit 1 includes the electrical component box 2 and the refrigerant cooling heat sink 13 that cools the electrical component box 2. Also, the electrical component box 2 includes the casing 4, the common components that are common regardless of the capability of the air conditioner, the specific components that are different in accordance with the capability of the air conditioner, and the sub-heat sink 8 that is formed into the plate shape and includes the specific components disposed thereon.

The sub-heat sink 8 includes the hole portions for attachment to the casing 4 at common positions regardless of the capability of the air conditioner and includes the hole portions for arrangement of the specific components at specific positions in accordance with the capability of the air conditioner and is adapted to be changed in accordance with the capability of the air conditioner, while the casing 4 incudes the opening part 20 formed in one surface, is brought into a state in which the opening part 20 is blocked and the specific components are located inside the electrical component box 2 by attaching the sub-heat sink 8, and can be shared regardless of the capability of the air conditioner.

In this manner, it is only necessary to replace the sub-heat sink 8 with the electrical components in accordance with the capability of the air conditioner mounted thereon each time without changing the casing 4 itself, and it is thus possible to share the casing 4 and to accommodate the electrical components of different types and numbers without providing unnecessary hole portions.

Also, the sub-heat sink 8 is provided in a state where it comes into contact with the refrigerant cooling heat sink 13, and the components with relatively large amounts of heat generation from among the electrical components are disposed along the refrigerant cooling heat sink 13. It is thus possible to efficiently cool the electrical components and to curb a temperature rise inside the electrical component box 2.

Additionally, the outdoor unit 1 includes the electrical component box 2 and the waterproof cover 3 accommodating the electrical component box 2 in the aspect in which it covers the upper surface, the side surfaces, and the back surface of the electrical component box 2. The electrical component box 2 includes, on the upper end side thereof, the claw portion 5 provided to be hooked on the structure portion of the outdoor unit 1 and includes, in the side surface thereof, the box-side projecting portion 23 that is formed to extend in the up-down direction and projects outward from the side surface. Also, the waterproof cover 3 includes, in the side surface thereof, the cover-side projecting portion 24 that is formed to extend in the up-down direction and projects inward from the side surface.

Then, the electrical component box 2 is disposed in the waterproof cover 3 from the front side in the state where the claw portion 5 is hooked on the structure portion of the outdoor unit 1 and is temporarily fixed in a state where movement in the front-back direction is curbed by the box-side projecting portion 23 getting over the cover-side projecting portion 24 when it is disposed in the waterproof cover 3.

In this manner, forward movement of the electrical component box 2 is curbed and is temporarily fixed in the state by the box-side projecting portion 23 getting over the cover-side projecting portion 24 when the electrical component box 2 is pushed into the waterproof cover 3, and it is thus possible to curb the electrical component box 2 swinging back and forth and to reduce the concern of deterioration of operability and degradation of operator's safety.

Also, each of the box-side projecting portion 23 and the cover-side projecting portion 24 is formed by drawing the member forming the side surface. In this manner, the temporary attachment structure of the electrical component box 2 is provided without any need of additional components. In this case, deflection occurs at each projecting portion, more strictly, in the surface in which each projecting portion is provided by providing each projecting portion at the position separated from the edges of the surface in which each projecting portion is formed, and it is thus possible to easily dispose the electrical component box 2 at the temporary attachment position without excessively applying a force.

Although some embodiments of the present invention have been described hitherto, these embodiments have been presented as examples and are not intended to limit the scope of the invention. These novel embodiments can be implemented in other various modes, and various omissions, replacements, and modifications can be made without departing from the gist of the invention. These embodiments and variations thereof are included in the scope and the gist of the invention and are also included in the inventions described in the claims and a scope equivalent thereto. Also, the components illustrated as examples in each embodiment can be appropriately combined.

The invention claimed is:

1. An outdoor unit of an air conditioner, comprising:
an electrical component box;
a waterproof cover that covers the electrical component box; and
a refrigerant cooling heat sink that cools the electrical component box, wherein
the refrigerant cooling heat sink is attached to an inner surface of the waterproof cover,
a relative position of the electrical component box with respect to the refrigerant cooling heat sink is set by the electrical component box being attached to a predetermined position of the waterproof cover,
the refrigerant cooling heat sink includes a main body portion that comes into contact with the electrical component box and a refrigerant pipe through which a refrigerant flows, and the refrigerant cooling heat sink is attached to the waterproof cover by fixing the refrigerant pipe to the waterproof cover with an attachment member, and
the main body portion of the refrigerant cooling heat sink is not directly fixed to the waterproof cover.

2. The outdoor unit of an air conditioner according to claim 1, wherein the electrical component box is provided with a guide portion on a side on which the refrigerant cooling heat sink comes into contact with the electrical component box, the guide portion including a contact surface with which the refrigerant cooling heat sink comes into contact and inclined surfaces that rise from end portions of the contact surface and are inclined toward the contact surface.

3. The outdoor unit of an air conditioner according to claim 1, wherein the electrical component box is covered in a state where a clearance from the inner surface of the waterproof cover is present.

4. An outdoor unit of an air conditioner, comprising:
an electrical component box;
a waterproof cover that covers the electrical component box; and
a refrigerant cooling heat sink that cools the electrical component box, wherein
the refrigerant cooling heat sink is attached to an inner surface of the waterproof cover,
a relative position of the electrical component box with respect to the refrigerant cooling heat sink is set by the electrical component box being attached to a predetermined position of the waterproof cover,
wherein the electrical component box is provided with a guide portion on a side on which the refrigerant cooling heat sink comes into contact with the electrical component box, the guide portion including a contact surface with which the refrigerant cooling heat sink comes into contact and inclined surfaces that rise from end portions of the contact surface and are inclined toward the contact surface,
wherein the refrigerant cooling heat sink includes a main body portion that comes into contact with the electrical component box and a refrigerant pipe through which a refrigerant flows, and the refrigerant cooling heat sink is attached to the waterproof cover by fixing the refrigerant pipe to the waterproof cover with an attachment member,
wherein the main body portion of the refrigerant cooling heat sink is not directly fixed to the waterproof cover.

5. The outdoor unit of an air conditioner according to claim 2, wherein the electrical component box is covered in a state where a clearance from the inner surface of the waterproof cover is present.

6. The outdoor unit of an air conditioner according to claim 4, wherein the electrical component box is covered in a state where a clearance from the inner surface of the waterproof cover is present.

* * * * *